United States Patent [19]
McTeer

[11] Patent Number: 5,990,011
[45] Date of Patent: Nov. 23, 1999

[54] TITANIUM ALUMINUM ALLOY WETTING LAYER FOR IMPROVED ALUMINUM FILLING OF DAMESCENE TRENCHES

[75] Inventor: E. Allen McTeer, Meridian, Id.

[73] Assignee: Micron Technology, Inc., Boise, Id.

[21] Appl. No.: 08/932,839

[22] Filed: Sep. 18, 1997

[51] Int. Cl.⁶ .................................................. H01L 21/00
[52] U.S. Cl. ........................ 438/692; 216/38; 257/751; 257/752; 257/774; 438/720; 438/742
[58] Field of Search ................................... 216/18, 38, 39, 216/75, 88, 100; 438/631, 633, 637, 643, 644, 672, 692, 723, 720, 742, 743–745; 257/751, 752, 774

[56] References Cited

U.S. PATENT DOCUMENTS

| | | | |
|---|---|---|---|
| 5,209,817 | 5/1993 | Ahmad et al. | 216/38 X |
| 5,262,354 | 11/1993 | Cote et al. | 437/195 |
| 5,300,813 | 4/1994 | Joshi et al. | 257/752 |
| 5,422,310 | 6/1995 | Ito | 438/742 X |
| 5,563,099 | 10/1996 | Grass | 437/192 |
| 5,821,168 | 10/1998 | Jain | 216/38 X |

OTHER PUBLICATIONS

G. Yao, et al., Charaterization of Ti TiN, TiAl Films As Wetting Layers For Aluminum Planarization, pp. 220–222, Jun. 27–29, 1995 VMIC Conference, ISMIC—104/95/0220.

*Primary Examiner*—William Powell
*Attorney, Agent, or Firm*—Workman, Nydegger and Seeley

[57] ABSTRACT

The novel process forms a first recess, such as a contact hole, within a first dielectric layer upon a semiconductor substrate. At least one diffusion barrier layer, selected from a group consisting of ceramics, metallics, and intermetallics, is formed within the first recess and at least partially conformably formed upon the first dielectric layer. A first electrically conductive layer is then formed within the recess over a said diffusion barrier layer. Preferably, the first electrically conductive layer is substantially composed of tungsten. The first electrically conductive layer is planarized above the recess thereby forming a top surface thereof. A second dielectric layer is formed over the first dielectric layer and said first electrically conductive layer. A second recess is formed in the second dielectric layer. The second recess extends from an upper surface of the second dielectric layer to the top surface of the first electrically conductive layer. The second recess has a bottom formed at least partially by the top surface of the first electrically conductive layer. A wetting layer composed of a titanium-aluminum alloy, is formed within the second recess over the second dielectric layer. A second electrically conductive layer then formed to substantially fill the second recess over the wetting layer. The wetting layer enables the second electrically conductive layer to substantially fill the second recess while being deposited at lower temperatures than conventional deposition processes. A portion of the wetting layer and the electrically conductive layer situated above the upper surface of the second dielectric layer is selectively removed by planarizing to form a planar top surface.

32 Claims, 2 Drawing Sheets

TITANIUM ALUMINUM ALLOY WETTING LAYER FOR IMPROVED ALUMINUM FILLING OF DAMESCENE TRENCHES

BACKGROUND OF THE INVENTION

1. The Field of the Invention

The present invention relates to a metallized integrated circuit structure, and particularly to a metallized interconnect structure situated on a semiconductor substrate assembly that utilizes a titanium-aluminum wetting layer and methods for making the metallized interconnect structure.

2. The Relevant Technology

Current technology for metallization of an integrated circuit involves the forming of a conductive layer over the integrated circuit. A typical metallization process is one that is performed at the "back end of the line" which is after the formation of integrated circuits that are to be wired by the metallization process. A single conductive layer is often formed so that it is situated above the integrated circuit to be wired. After the conductive layer is formed, it is then patterned and etched into a shape of the desired wiring necessary to metallize the integrated circuit. Since the conductive layer is situated above the integrated circuit, the resultant metallization will also be above the integrated circuit in a "wiring up" scheme.

Another type of metallization involves the formation of a conductive layer for the integrated circuit in a recess composed of an electrically insulative or dielectric material. Such a wiring scheme may be described as a "wiring down" or damascene scheme. The recess can be either a trench, a hole, or a via. Various wetting layers within the recess and underneath a conductive layer in a metallization scheme have been used to aid the filling process of the recess. Conventional wetting layers, however, cause incomplete recess filling such that there are voids in the recess, resulting in incomplete metallization lines.

Depending upon the aspect ratio of the recess, poor step coverage of the conductive layer within the recess may result. Voids in the conductive layer within the recess may also result when the conductive layer does not completely fill up the recess. Voids and poor step coverage can cause the integrated circuit to experience an electrical failure. The electrical failure can be experienced during fabrication of the integrated circuit or after a period of time that the integrated circuit has been in use, such as where electrical contact with the conductive layer in the recess has been lost because the material of the conductive layer migrates, shifts, or otherwise moves.

Current technology requires high deposition temperatures for the conductive layer that is deposited upon the previously deposited wetting layers to achieve a substantially complete filling of the recess. Conventional deposition equipment are unable to deposit recess metallization materials, such as aluminum, at production rates with conventional high deposition temperatures.

It would be an advantage in the art to overcome the problems of poor step coverage and voids. It would further be an advantage in the art to overcome the problems presented by a high deposition temperature requirement.

SUMMARY OF THE INVENTION

In accordance with the invention as embodied and broadly described herein, the present invention relates to the method for manufacturing an interconnect structure situated on a semiconductor substrate. A novel interconnect structure is also disclosed.

In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

The novel interconnect structure disclosed herein is formed on a semiconductor substrate. The novel process forms a first recess having a specified geometric shape within a first dielectric layer on the semiconductor substrate. The first recess can be a trench, a hole, a via, or a combination of a trench and hole or via. The first recess can be formed by dry etching or other recess-creating processes. Following the creation of a first recess in the first dielectric layer, at least one diffusion barrier layer is formed within the first recess over the first dielectric layer. The diffusion barrier layer is at least partially conformably formed upon the first dielectric layer. The material from which the diffusion barrier layer is substantially composed is preferably selected from a group consisting of ceramics, metallics, and intermetallics.

A first electrically conductive layer is then formed with the first recess over the diffusion barrier layer. The first electrically conductive layer is preferably a current carrier for electrical signals that will communicate with an integrated circuit associated therewith. Preferably, the first electrically conductive layer is substantially composed of tungsten. A portion of the first electrically conductive layer situated above the first recess is then selectively removed by planarization so as to form a top surface of the first electrically conductive layer.

A second dielectric layer is formed over both the first dielectric layer and the first electrically conductive layer. A second recess is formed in the second dielectric layer. The second recess extends from an upper surface of the second dielectric layer to the top surface of a first electrically conductive layer. The second recess has a bottom surface formed at least partially by the top surface of the first electrically conductive layer.

Following the creation of the second recess in the second dielectric layer, a wetting layer is formed within the second recess over the second dielectric layer. Preferably the wetting layer comprises an titanium-aluminum alloy.

A second electrically conductive layer is then formed within the second recess over the wetting layer. The second electrically conductive layer is selected from a group consisting of aluminum, seledrium, copper, aluminum copper, aluminum alloys and derivatives thereof. The titanium-aluminum wetting layer enables the second electrically conductive layer to substantially fill the second recess while it is deposited at lower deposition temperatures than conventional deposition processes.

A portion of the wetting layer and the electrically conductive layer situated above the upper surface of the second dielectric layer is selectively removed by planarization to form a planar top surface thereof.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
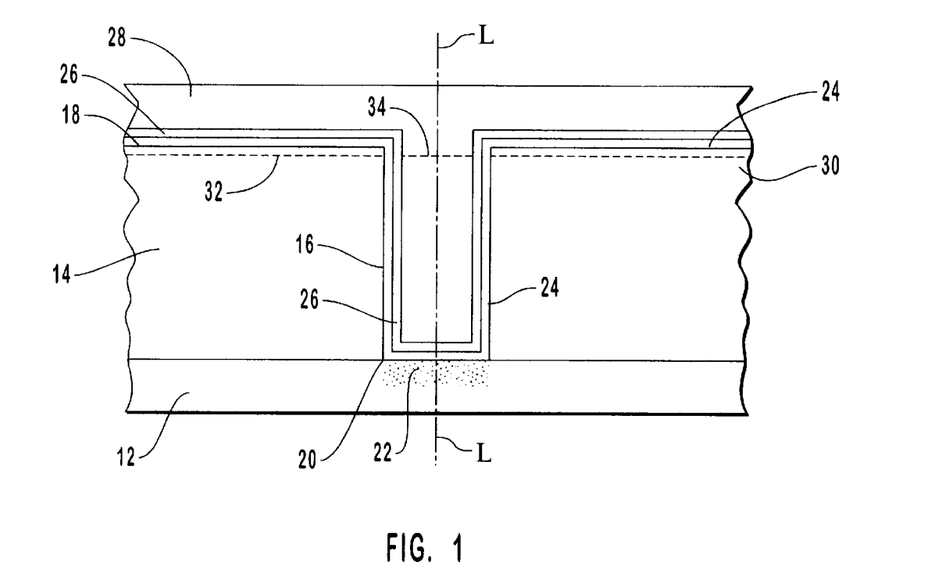
FIG. 1 is a partial cross-sectional elevation view of a first dielectric layer situated upon a silicon layer of a semiconductor wafer, the first dielectric layer having a contact hole therein that is filled with a liner and cylindrical contact plug combination.

FIG. 1 depicts a semiconductor wafer 10 having a silicon layer 12 formed thereon. A first dielectric layer 14 is formed upon silicon layer 12. A first recess, such as a contact hole 16, extends from an upper surface 18 of first dielectric layer 14 to silicon layer 12. In the embodiment illustrated in FIG. 1, contact hole 16 has a cylindrical configuration.

To initiate the metallization process, first dielectric layer 14 is formed upon silicon layer 12 by conventional processing, such as depositing doped or undoped silicon dioxide by various deposition processes. Preferably, first dielectric layer 14 is composed of a dielectric material selected from the group consisting of silicon dioxide, silicate glass, and mixtures or derivatives thereof. Most preferably, first dielectric layer 14 is composed of borophosphosilicate glass (BPSG), borosilicate glass (BSG), phosphosilicate glass (PSG), and mixtures or derivatives thereof. Next, first dielectric material 14 has contact hole 16 formed therein. Contact hole 16 is formed by conventional processing methods such as patterning and etching. Contact hole 16 comprises a bottom 20 that is formed by a top surface of silicon layer 12. Contact hole 16 has a cylindrical shape about a vertical axis L illustrated in FIG. 1.

Once contact hole 16 within first dielectric layer 14 has been formed, in the desired number and configuration, the next step is an optional doping process. When it is desirable to dope portions of silicon layer 12 so as to form a doped area 22 in silicon layer 12.

The next step in the novel process is to fill contact hole 16 in first dielectric layer 14. By way of example, a conventional contact plug formation method may be used. In forming the contact plug, at least one diffusion barrier layer is formed within contact hole 16 over dielectric layer 14 and doped area 22, if any, to prevent the diffusion into silicon layer 12 of subsequently formed layers within contact hole 16. As shown in FIG. 1, a first barrier layer 24 is deposited within contact hole 16 over dielectric layer 14. First barrier layer 24 preferably functions as an adhesion layer for materials formed thereon, and will also be used to form a refractory metal silicide, such as titanium silicide, which enhances contact performance. First barrier layer 24 will preferably be a substantially continuous coating of material over both contact hole 16 and first dielectric layer 14, and will preferably be substantially composed of refractory metals or nitrides thereof, such as titanium, tungsten, tantalum, titanium nitride, tungsten nitride, or tantalum nitride. Most preferably, first barrier layer 24 is substantially composed of titanium.

In the embodiment illustrated in FIG. 1, a second barrier layer 26 is deposited within contact hole 16 over first barrier layer 24. Second barrier layer 26 serves as a diffusion barrier layer to prevent the diffusion of material therethrough. In general, first barrier layer 24 and second barrier layer 26 may be comprised of refractory metals or nitrides thereof, such as titanium, tungsten, tantalum, titanium nitride, tungsten nitride, or tantalum nitride. Most preferably, first barrier layer 24 is substantially composed of titanium and second barrier layer 26 preferably is substantially composed of titanium-nitride.

A heat treatment is preferably performed after second barrier layer 26 is formed. A preferable deposition sequence for refractory metal materials is a deposition of titanium followed by a deposition of titanium nitride, and then a rapid thermal processing step.

The formation of a first electrically conductive layer 28 is the next step to fill contact hole 16. While first electrically conductive layer 28 will preferably be composed of typical metallization conductor materials, the composition of first electrically conductive layer 28 may depend on the aspect ratio of the recesses that are formed within first dielectric layer 14. In one embodiment, first electrically conductive layer 28 formed a contact plug substantially composed of tungsten which is formed utilizing conventional contact plug processes so as to substantially fill contact hole 16.

Once first electrically conductive layer 28 substantially fills contact hole 16, a preferable step is the selective removal of materials from semiconductor wafer 10 by an abrasive planarizing process, such as chemical mechanical planarizing (CMP) or a dry etch back step. Any material from first electrically conductive layer 28, first barrier layer 24, and second barrier layer 26 above first dielectric layer 14 will be selectively planarized to form a first planarization surface 30 shown in FIG. 1. A top surface 32 of first dielectric layer 14 and a top surface 34 of first electrically conductive layer 28 are co-planar with first planarization surface 30.

Figure 2:
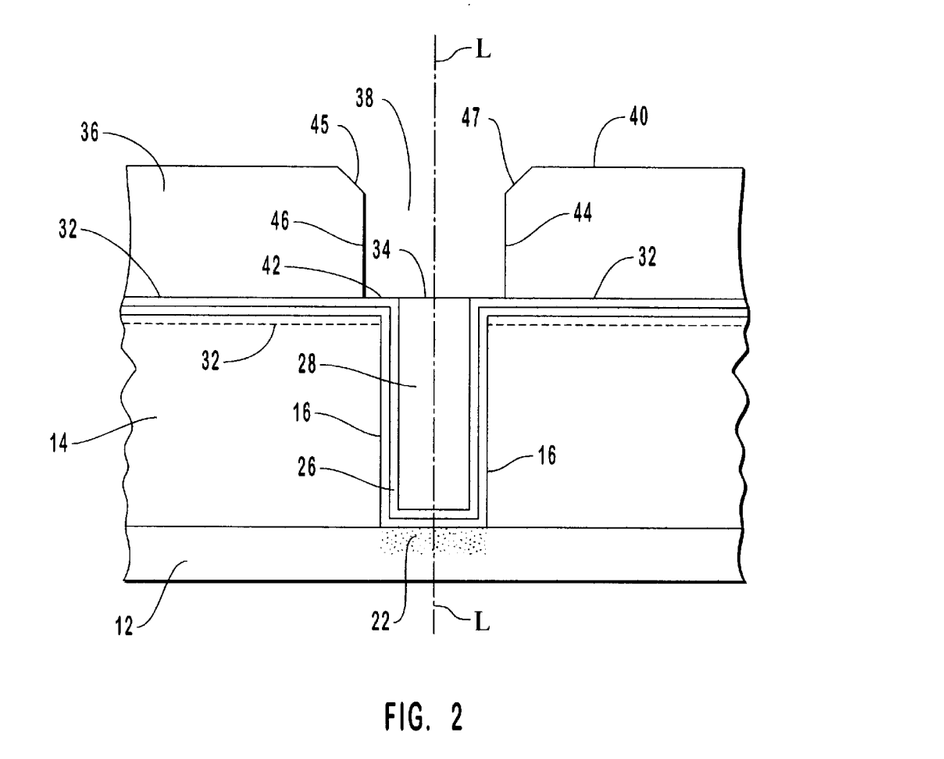
FIG. 2 is a partial cross-sectional elevation view of the structure seen in FIG. 1, wherein the liner and cylindrical contact plug combination has been planarized to form a top surface thereof that is co-planar with a top surface of the first dielectric layer, over which has been formed a second dielectric layer having a trench therein having a bottom at the top surface of the liner and cylindrical contact plug combination.

The next step in the inventive process is to form a second dielectric layer 36 over top surface 32 of first dielectric layer 14 and top surface 34 of first conductor layer 28 as is shown in FIG. 2. Preferably, second dielectric layer 36 is composed of a dielectric material selected from the group consisting of silicon dioxide, silicate glass, and mixtures or derivatives thereof. Most preferably, second dielectric layer 36 is substantially composed of undoped silicon dioxide formed by decomposition of a TEOS precursor. Second dielectric layer 36 is formed by conventional processing, such as depositing doped or undoped oxide by various deposition processes.

Second dielectric layer 36 has recesses formed therein, including by way of example and not limitation, a trench 38. Trench 38 is formed by conventional processing methods such as patterning and etching. Trench 38 extends from an upper surface 40 of second dielectric layer 36 to top surface 34 of first electrically conductive layer 28. Trench 38 may have various sizes and configurations that are equally effective in carrying out the intended function thereof.

The position of trench 38 may vary about vertical axis L of contact hole 16. By way of example and not limitation, trench 38 may have a bottom that contacts only top surface 34 of first electrically conductive layer 28 or, as illustrated in FIG. 2, may have a bottom 42 that is formed partially by top surface 34 of first electrically conductive layer 28 and by top surface 32 of first dielectric layer 14. The position of trench 38 about vertical axis L, is limited by the requirement that some portion of bottom 42 be formed by top surface 34 of first conductive layer 28. Trench 38 also comprises sidewalls 44, 46 that extend generally upward from bottom 42 to surface 40 of second dielectric layer 36.

Figure 3:
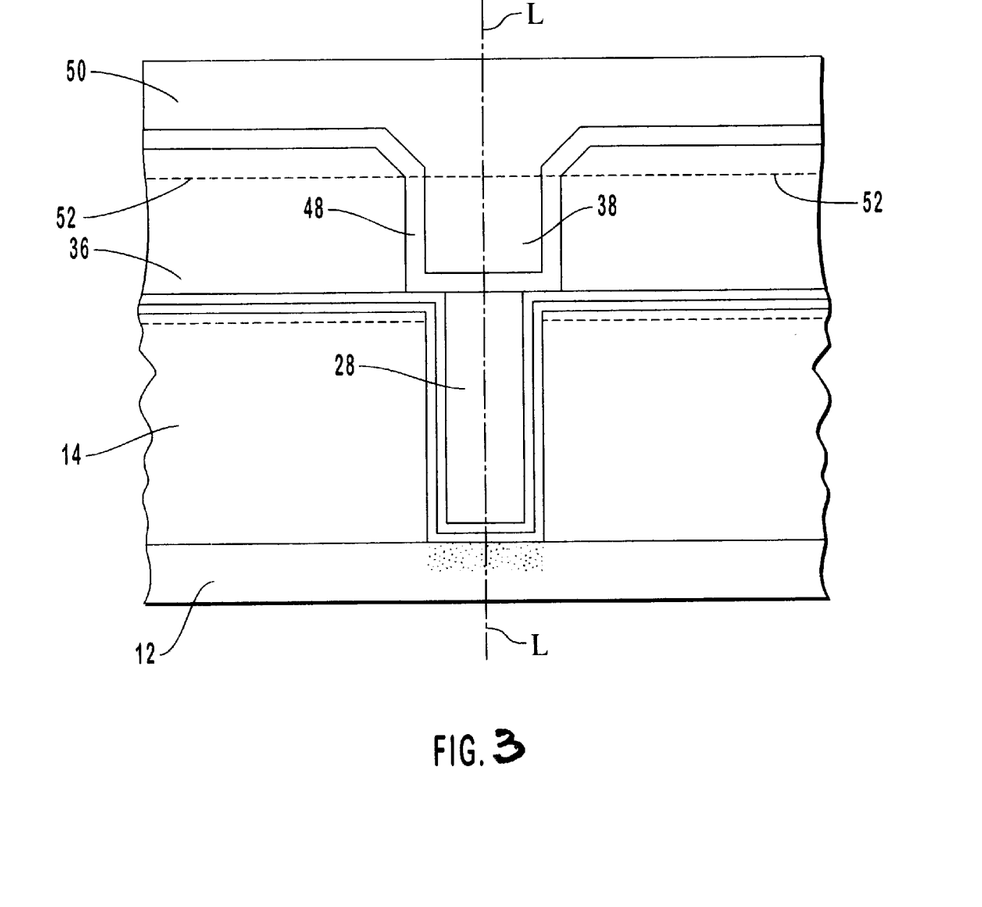
FIG. 3 is a partial cross-sectional elevation view of the structure seen in FIG. 2, wherein the trench has a wetting layer therein upon which a second dielectric material is situated that substantially fills the trench.

The combination of trench 38 and contact hole 16 in the structure illustrated in FIGS. 2 and 3 is an example of a damascene structure. A damascene structure tends to have a high aspect ratio, typically greater than about 2 to 1 (2:1) and small line width, typically about 0.25 $\mu$m in width. Aspect ratios of such dimension make a damascene structure difficult to substantially fill. A particular problem with the damascene structure is the tendency during sputtering, or physical vapor deposition (PVD) for the top of the damascene structure to form cusps thereat in a phenomena known as "bread loafing".

To overcome the problem of bread loafing, it may be desirable to selectively remove portions of second dielectric layer 36 at the intersection of sidewalls 44, 46 of trench 38 and upper surface 40 of second dielectric layer 36. Such selective removal process is called facet etching. Facet etching causes the upper most corners of trench 38 to be etched at a greater material removal rate than the horizontal or vertical surfaces. FIG. 2 illustrates the configuration of trench 38 upon completion of facet etching so as to create facets 45, 47. The resulting angles on sidewalls 44, 46, seen as facets 45, 47, respectively, have a slope that helps to prevents trench 38 from bread loafing and being pinched off at the opening thereof prior to substantially complete filling of trench 38, thus improving the metallization process and the filling of trench 38. Facet etching is optional depending on the aspect ratio and complexity of the configuration of the damascene structure.

The next step in the inventive method is the formation of a wetting layer 48 within trench 38 and over second dielectric layer 36 as illustrated in FIG. 3. Wetting layer 48 will preferably be a substantially continuous coating of material within trench 38 and over second dielectric layer 36. Wetting layer 48 is an underlying film that improves the mobility of a subsequently formed second electrically conductive layer 50 also seen in FIG. 3.

The composition of material from which wetting layer 48 is made is dependent on the composition of second electrically conductive layer 50. Wetting layer 48 may be substantially composed of, for example, titanium, titanium/titanium-nitride, titanium-nitride, titanium-aluminum, titanium-tungsten, or titanium-aluminide. Preferably wetting layer 48 comprises a titanium-aluminum alloy or TiAl$_x$, where "x" is greater than 0.3 and preferably greater than 0.6, and second electrically conductive layer 50 is preferably substantially composed of aluminum. A higher aluminum content for "x" within the alloy TiAl$_x$ is preferable because the higher aluminum content limits reactions between wetting layer 48 and second electrically conductive layer 50. Reduction of the amount of the aluminum content for "x" within the alloy TiAl$_x$ is limited, in that too great of a reduction will cause too much aluminum to be consumed in a reaction with second electrically conductive layer 50, which will render wetting layer 48 less effective.

While second electrically conductive layer 50 is preferably substantially composed of aluminum, it can also be composed of typical metallization conductor materials including aluminum alloys, seledrium, copper, aluminum copper or pure aluminum. The composition of second electrically conductive layer 50, however, may depend on the aspect ratio of trench 38 within second dielectric layer 36.

The preferred method of forming second electrically conductive layer 50 utilizes a cold-hot/fast-slow hot aluminum deposition. Wetting layer 48, with the two step aluminum deposition of second conductor layer 59, enables second electrically conductive layer 50 to have improved fill of trench 38 and, consequently, results in a more thorough, robust metallization technique. The advantage of using a titanium-aluminum wetting layer 48 with a substantially aluminum second electrically conductive layer 50 is also that second electrically conductive layer 50 can be deposited at lower temperatures. The preferred method is a low deposition rate of 0.5 microns per minute or less, and a low temperature that is greater than about 300° C. Deposition rates of second electrically conductive layer 50 greater than 0.5 microns per minute at a temperature less than 300° C. result in incomplete fill of the damascene structure even with wetting layer 48. From a production standpoint, the temperature is lowered to below 600° C. because conventional deposition equipment for aluminum is not able to withstand higher temperatures on a production basis.

To ensure a substantial filling of trench 8 with second electrically conductive layer 50, it may also be preferable to force fill the aluminum thereof. This method uses a pressure above atmospheric pressure to fill the aluminum in trench 38, which high pressure may also be accompanied by an elevated temperature of aluminum in a hot aluminum reflow process. The aluminum is deposited utilizing a PVD process which is then heated to cause the aluminum to flow on wetting layer 48 to fill trench 38 during PVD in combination with high pressure fill.

An alternative to a high pressure fill process is an aluminum reflow process for substantial filling of trench 38. The aluminum reflow process applies energy to second electrically conductive layer 50 and wetting layer 48. Second electrically conductive layer 50 is then able to flow and fill voids that have formed in trench 38 within second dielectric layer 36. With the voids removed, desirable step coverage and substantial filling within trench 38 of second dielectric layer 36 is achieved. Examples of ways to apply energy to second electrically conductive layer 50 include, but are not limited to, lasers, tube furnaces, rapid thermal processing, or other kinds of radiant or thermal energy.

Next, portions of wetting layer 48, second electrically conductive layer 50, and second dielectric layer 36 are selectively removed until a second planarization surface 52 is formed as illustrated in FIG. 3. Second planarization surface 52 is preferably formed by a CMP process. The planarizing operation enables second dielectric layer 36 to electrically isolate second electrically conductive layer 50. The CMP process is a relatively clean process when wetting layer 48 is substantially composed of a titanium-aluminum alloy. As such, the planarizing process will not induce voids or defects in the metal lines and substantially no residues will be left between metal lines.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for manufacturing, an interconnect structure:

forming a first recess within a first dielectric layer situated on a semiconductor substrate, said first recess extending from an upper surface of said first dielectric layer to terminate at a bottom thereof on a top surface of said semiconductor substrate;

substantially filling said first recess with a first electrically conductive layer;

selectively removing a portion of said first electrically conductive layer that is situated above said first recess;

forming a second dielectric layer on both said first dielectric layer and said first electrically conductive layer;

forming a second recess within said second dielectric layer, said second recess extending from an upper surface of said second dielectric layer to terminate at a bottom thereof on a top surface of said first electrically conductive layer within said first recess, said second recess having a sidewall extending from the bottom of said second recess to said upper surface of said second dielectric layer;

forming a wetting layer within said second recess and on said second dielectric layer;

substantially filling said second recess with a second electrically conductive layer over said wetting layer at a temperature in a range from about 300° C. to about 550° C.; and selectively removing a portion of said wetting layer and said second electrically conductive layer that are situated above said second recess.

2. A method for manufacturing an interconnect structure as recited in claim 1, wherein said second recess is substantially filled with said second electrically conductive layer by a deposition process having a deposition rate of said second dielectric conductive layer less than or equal to 0.5 microns per minute.

3. A method for manufacturing an interconnect structure as recited in claim 1, wherein said wetting layer comprises material selected from a group consisting of titanium-aluminum, titanium, titanium/titanium-nitride, and titanium-nitride.

4. A method for manufacturing an interconnect structure as recited in claim 1, wherein said second electrically conductive layer is composed of material selected from a group consisting of aluminum, aluminum alloys, copper, AlCuTi, aluminum copper, and aluminum copper alloys.

5. A method for manufacturing an interconnect structure as recited in claim 1, wherein said wetting layer comprises $TiAl_x$, and wherein x is greater than about 0.3, and said second electrically conductive layer is substantially composed of a material selected from a group consisting of aluminum and aluminum alloys.

6. A method for manufacturing an interconnect structure as recited in claim 1, wherein said second electrically if formed by a physical vapor deposition process.

7. A method for manufacturing an interconnect structure as recited in claim 1, further comprising, prior to selectively removing said portion of said wetting layer and said second electrically conductive layer, applying energy to said second electrically conductive layer to cause said second electrically conductive layer to flow within said second recess.

8. A method for manufacturing an interconnect structure as recited in claim 1, wherein substantially filling said first recess with said first electrically conductive layer further comprises:

forming a first barrier layer within said first recess and on said first dielectric layer;

applying energy to said first barrier layer to react with said semiconductor substrate and thereby form a silicide composition at the bottom of said first recess; and forming a second barrier layer within said first recess and on said first barrier layer.

9. A method for manufacturing an interconnect structure as recited in claim 8, wherein forming said first barrier layer within said first recess and on said first dielectric layer is accomplished in a chemical vapor deposition process, and wherein said first barrier layer is substantially composed of a material selected from the group consisting of aluminum nitride, tungsten nitride, titanium nitride, and tantalum nitride.

10. A method for manufacturing an interconnect structure as recited in claim 1, further comprising selectively removing portions of said second dielectric layer at an opening of said second recess situated at an intersection of said sidewall of said second recess and said upper surface of said second dielectric layer, said opening of said second recess having a greater width than the bottom of said second recess.

11. A method for manufacturing an interconnect structure:

forming a first recess within a first dielectric layer situated on a semiconductor substrate, said first recess extending from an upper surface of said first dielectric layer to terminate at a bottom thereof on a top surface of said semiconductor substrate;

substantially filling said first recess with a first electrically conductive layer;

selectively removing a portion of said first electrically conductive layer that is situated above said first recess;

forming a second dielectric layer on both said first dielectric layer and said first electrically conductive layer;

forming a second recess within said second dielectric layer, said second recess extending from an upper surface of said second dielectric layer to terminate at a bottom thereof on a top surface of said first electrically conductive layer within said first recess, said second recess having a sidewall extending from the bottom of said second recess to said upper surface of said second dielectric layer;

forming a wetting layer within said second recess and on said second dielectric layer, wherein said wetting layer comprises $TiAl_x$, and wherein x is greater than about 0.3;

substantially filling said second recess over said wetting layer with a second electrically conductive layer substantially composed of a material selected from a group consisting of aluminum and aluminum alloys; and selectively removing a portion of said wetting layer and said second electrically conductive layer that are situated above said second recess.

12. A method for manufacturing an interconnect structure as recited in claim 11, wherein said second recess is substantially filled with said second electrically conductive layer by a physical vapor deposition process conducted at a temperature in a range from about 300° C. to about 500° C. and having a deposition rate of said second dielectric conductive layer less than or equal to 0.5 microns per minute.

13. A method for manufacturing an interconnect structure as recited in claim 11, further comprising, prior to selectively removing said portion of said wetting layer and said second electrically conductive layer, applying energy to said second electrically conductive layer to cause said second electrically conductive layer to flow within said second recess.

14. A method for manufacturing an interconnect structure as recited in claim 11, wherein substantially filling said first recess with said first electrically conductive layer further comprises:
    forming a first barrier layer within said first recess and on said first dielectric layer;
    forming a second barrier layer within said first recess and on said first barrier layer; and
    forming a silicide composition at the bottom of said first recess from a reaction of said first barrier layer with said semiconductor substrate.

15. A method for manufacturing an interconnect structure as recited in claim 11, further comprising:
    selectively removing portions of said second dielectric layer at an opening of said second recess situated at an intersection of said sidewall of said second recess and said upper surface of said second dielectric layer, said opening of said second recess having a width greater than or equal to that of the bottom of said second recess.

16. A method for manufacturing an interconnect structure:
    patterning and etching a first dielectric layer situated on a silicon layer so as to form a first recess within said first dielectric material, said first recess being situated below an upper surface of said first dielectric layer and terminating at a bottom on said silicon layer;
    doping said silicon layer below and adjacent to said bottom of said first recess, whereby a doped area is formed within said silicon layer;
    depositing a first barrier layer within said first recess and on said first dielectric layer, said diffusion layer being substantially composed of a material selected from the group consisting of ceramics, metallics, and intermetallics;
    substantially filling said first recess with a first electrically conductive layer;
    selectively removing a portion of said first electrically conductive layer that is situated above said first recess, thereby forming a top surface of said first electrically conductive layer;
    forming a second dialectic layer on said first dielectric layer and on said top surface of said first electrically conductive layer;
    forming a second recess within said second dielectric layer, said second recess extending from an upper surface of said second dielectric layer to terminate at said top surface of said first electrically conductive layer within said first recess, said second recess comprising a bottom at least partially formed by said top surface of said first electrically conductive layer within said recess, said second recess further comprising a sidewall extending from said bottom of said second recess to said upper surface of said second dielectric layer;
    forming a wetting layer within said second recess and on said second dialectic layer, said wetting layer being substantially composed of a material selected from a group consisting of titanium-aluminum, titanium-tungsten, titanium, titanium-aluminide, titanium/titanium-nitride, and titanium-nitride with aluminum alloys;
    forming a second electrically conductive layer over said wetting layer so as to substantially fill said second recess, said second electrically conductive layer being substantially composed of a material selected from a group consisting of aluminum, copper, aluminum copper, and aluminum alloys; and
    selectively removing a portion of said wetting layer and said second electrically conductive layer situated above said upper surface of said second dielectric layer.

17. A method for manufacturing an interconnect structure as recited in claim 16, wherein doping said silicon layer below and adjacent to said bottom of said first recess comprises:
    forming a dopant barrier layer at the bottom of first recess on said silicon layer; and
    implanting ions through said dopant barrier layer into said silicon layer.

18. A method for manufacturing an interconnect structure as recited in claim 16, wherein said wetting layer is substantially composed of $TiAl_x$, wherein x is approximately 0.3 or greater, and wherein said second electrically conductive layer being substantially composed of a material selected from a group consisting of aluminum and aluminum alloys.

19. A method for manufacturing an interconnect structure as recited in claim 16, wherein said second electrically conductive layer is deposited over said wetting layer in a physical vapor deposition process having a deposition rate of said second dielectric conductive layer less than or equal to 0.5 microns per minute that is conducted at a temperature in a range from about 300° C. to about 550° C.

20. A method for manufacturing an interconnect structure as recited in claim 16, further comprising, prior to selectively removing a portion of said first electrically conductive layer that is situated above said first recess:
    applying energy to said first barrier layer to react with said silicon layer and thereby form a silicide composition at the bottom of said first recess; and
    forming a second barrier layer within said first recess and on said first barrier layer.

21. A method for manufacturing an interconnect structure as recited in claim 16, wherein the material from which said first barrier layer is substantially composed is selected from a group consisting of ceramics, metallics, and intermetallics.

22. A method for manufacturing an interconnect structure as recited in claim 16, further comprising selectively removing portions of said second dielectric layer at an opening of said second recess situated at an intersection of said sidewall of said second recess and said upper surface of said second dielectric layer, said opening of said second recess having a greater width than the bottom of said second recess.

23. A method for manufacturing an interconnect structure:
    patterning and etching a first doped silica layer situated on a silicon layer so as to form a contact hole within said first doped silica layer, said contact hole extending from an upper surface of said first doped silica layer to terminate at a bottom on said silicon layer;
    doping said silicon layer below and adjacent to the bottom of said contact hole so as to form a doped area within said silicon layer;
    depositing a first barrier layer on within said contact hole on said bottom of said contact hole, said diffusion barrier layer being composed of a material selected from the group consisting of refractory metals and nitrides thereof;
    substantially filling said contact hole with a first electrically conductive layer;
    selectively removing a portion of said first electrically conductive layer that is situated above said contact hole;

forming a second doped silica layer on both said first doped silica layer and said first electrically conductive layer;

forming a trench within said second doped silica layer extending from a top surface of said second doped silica layer to terminate at a bottom on said first electrically conductive layer in said contact hole, said trench having a sidewall extending from said bottom of said trench to said top surface of said second dielectric layer;

depositing a wetting layer on said second doped silica layer, said wetting layer being substantially composed of titanium-aluminum;

depositing said second electrically conductive layer within said trench on said wetting layer in a physical vapor deposition conducted at a temperature in a range from about 300° C. to about 550° C., said second electrically conductive layer being substantially composed of a material selected from the group of aluminum or aluminum copper;

selectively removing portions of said second dielectric layer at an opening of said trench situated at an intersection of said sidewall of said trench and said upper surface of said second dielectric layer, said opening of said second recess having a greater width than the bottom of said trench; and applying energy to said electrically conductive layer to cause said second electrically conductive layer to flow on said wetting layer to substantially fill said trench.

24. A method for manufacturing an interconnect structure as recited in claim 23, wherein said wetting layer is substantially composed of $TiAl_x$, wherein x is greater than about 0.3, and wherein said second electrically conductive layer is substantially composed of a material selected from the group of aluminum and aluminum alloys.

25. A method for manufacturing an interconnect structure as recited in claim 23, wherein said second electrically conductive layer is deposited by a deposition rate of about less than or equal to 0.5 microns per minute.

26. A method for manufacturing an interconnect structure as recited in claim 23, wherein said first barrier layer comprises material selected from a group such as titanium, tungsten, titanium nitride, tungsten nitride, and tantalum nitride, said method further comprising, prior to substantially filling said contact hole with a first electrically conductive layer:

applying energy to said first barrier layer to react with said silicon layer and thereby form a silicide composition at the bottom of said contact hole; and forming a second barrier layer within said contact hole and on said first barrier layer.

27. An interconnect structure comprising:

a semiconductor substrate having a surface thereon defining a plane;

a first dielectric material on said semiconductor substrate having a planar top surface;

a contact hole defined by an inside surface of said first dielectric material, terminating on said semiconductor substrate, and extending to at an opposite end thereof at a top surface of said first dielectric material, said contact hole being oriented substantially perpendicular to said plane of said surface of said semiconductor substrate;

at least one diffusion barrier layer lining said inside surface of said contact hole;

a first electrically conductive layer substantially filling said contact hole, extending proximal to the bottom of said contact hole and terminating at the top planar surface of said first dielectric material;

a second dielectric material on said top surface of said first dielectric material adjacent to said contact hole extending to a top planar surface of said second dielectric material;

a trench defined by an inside surface of said second dielectric material, extending from said top planar surface of said first dielectric material adjacent to said contact hole, and terminating at an opposite end of said trench at said planar top surface of said second dielectric material, said trench also extending substantially parallel to said plane of said surface on said semiconductor substrate;

a wetting layer lining said inside surface of said trench; and a second electrically conductive layer disposed on said wetting layer and extending to terminate at said top planar surface of said second dielectric material.

28. An interconnect structure as recited in claim 27, wherein said contact hole is substantially cylindrical in shape.

29. An interconnect structure as recited in claim 27, wherein said wetting layer is substantially composed of titanium-aluminum.

30. An interconnect structure as recited in claim 27, wherein said wetting layer is substantially composed of $TiAl_x$, and wherein x is greater than about 0.3.

31. An interconnect structure as recited in claim 27, wherein said second electrically conductive layer is substantially composed of a material selected from the group aluminum, copper or combinations thereof.

32. An interconnect structure comprising:

a silicon layer having a surface thereon defining a plane, said silicon layer having thereon a refractory metal silicide layer;

a first doped silica layer on said silicon layer having a planar top surface;

a contact hole defined by an inside surface of said first doped silica layer and said refractory metal silicide layer, terminating on said refractory metal silicide layer on said silicon layer, and extending to an opposite end thereof at a top surface of said first doped silica layer, said contact hole being oriented substantially perpendicular to said plane of said surface of said silicon layer;

at least one diffusion barrier layer lining said inside surface of said contact hole and on said refractory metal silicide layer, wherein said at least one diffusion barrier layer is substantially composed of a material selected from the group consisting of aluminum nitride, tungsten nitride, titanium nitride, and tantalum nitride;

a refractory metal layer substantially filling said contact hole on said at least one diffusion barrier layer, extending proximal to the bottom of said contact hole, and terminating at the top planar surface of said first doped silica layer;

a second silica layer on said top surface of said first doped silica layer, adjacent to said contact hole, and extending to a top planar surface of said second silica layer;

a trench defined by an inside surface of said second silica layer, extending from said top planar surface of said first doped silica layer adjacent to said contact hole, and terminating at an opposite end of said trench at said planar top surface of said second silica layer, said trench also extending substantially parallel to said plane of said surface on said silicon layer;

a wetting layer lining said inside surface of said trench and being situated on said refractory metal layer, wherein said wetting layer is substantially composed of $TiAl_x$, and wherein x is greater than about 0.3; and a second electrically conductive layer disposed on said wetting layer and extending to terminate at said top planar surface of said second silica layer, wherein said second electrically conductive layer is substantially composed of a material selected from the group aluminum, copper or combinations thereof, said second electrically conductive layer being in contact with said refractory metal layer in said contact hole.

* * * * *

UNITED STATES PATENT AND TRADEMARK OFFICE
CERTIFICATE OF CORRECTION

Page 1 of 2

PATENT NO. : 5,990,011
DATED : Nov. 23, 1999
INVENTOR(S) : E. Allen McTeer

It is certified that error appears in the above-identified patent and that said Letters Patent is hereby corrected as shown below:

Cover Page, Other Publications, line 1, change "Charaterization" to --Characterization--

Cover Page, line 21, after "layer" insert --is--

Col. 2, line 46, after "comprises" change "an" to --a--

Col. 5, line 21, after "in a" change "phenomena" to --phenomenon--

Col. 5, line 34, change "prevents" to --prevent--

Col. 6, line 9, change "conductor layer 59" to --electrically conductive layer 50--

Col. 7, line 56, after "electrically" change "if" to --conductive layer is--

Col. 9, lines 44 and 60, after "second" change "dialectric" to --dielectric--

Col. 10, line 58, delete "on"

UNITED STATES PATENT AND TRADEMARK OFFICE
CERTIFICATE OF CORRECTION

PATENT NO. : 5,990,011
DATED : Nov. 23, 1999
INVENTOR(S) : E. Allen McTeer

It is certified that error appears in the above-identified patent and that said Letters Patent is hereby corrected as shown below:

Col. 11, line 61, after "to" delete "at"

Signed and Sealed this

Sixth Day of March, 2001

Attest:

NICHOLAS P. GODICI

Attesting Officer     Acting Director of the United States Patent and Trademark Office